(12) United States Patent
Kim

(10) Patent No.: US 10,431,152 B2
(45) Date of Patent: Oct. 1, 2019

(54) ORGANIC LIGHT-EMITTING DISPLAY DEVICE

(71) Applicant: LG Display Co., Ltd., Seoul (KR)

(72) Inventor: KyungMan Kim, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 169 days.

(21) Appl. No.: 15/250,718

(22) Filed: Aug. 29, 2016

(65) Prior Publication Data

US 2017/0169760 A1    Jun. 15, 2017

(30) Foreign Application Priority Data

Dec. 14, 2015  (KR) .................... 10-2015-0177922

(51) Int. Cl.
*H01L 27/32* (2006.01)
*G09G 3/3225* (2016.01)
*G09G 3/20* (2006.01)

(52) U.S. Cl.
CPC ......... *G09G 3/3225* (2013.01); *G09G 3/2003* (2013.01); *H01L 27/322* (2013.01); *H01L 27/326* (2013.01); *H01L 27/3213* (2013.01); *H01L 27/3218* (2013.01); *H01L 27/3262* (2013.01); *H01L 27/3276* (2013.01); *G09G 2300/0452* (2013.01); *H01L 27/3244* (2013.01)

(58) Field of Classification Search
CPC ............... H01L 27/124; H01L 27/3206; H01L 27/3211; H01L 27/3213; H01L 27/3218; H01L 27/3248; H01L 27/3262; H01L 27/3276; H01L 27/326
See application file for complete search history.

(56) References Cited

U.S. PATENT DOCUMENTS

| | | | | |
|---|---|---|---|---|
| 2002/0180902 A1* | 12/2002 | Izumi | ................... | G02F 1/13336 349/43 |
| 2009/0140253 A1* | 6/2009 | Kasahara | ............ | H01L 27/1214 257/59 |
| 2009/0206726 A1* | 8/2009 | Yamazaki | ........... | H01L 27/3211 313/498 |
| 2013/0002125 A1* | 1/2013 | Kimura | ............... | H01L 27/3213 313/498 |

* cited by examiner

*Primary Examiner* — Monica D Harrison
*Assistant Examiner* — John Lin
(74) *Attorney, Agent, or Firm* — Fenwick & West LLP

(57) ABSTRACT

A top-emission organic light-emitting display device includes a plurality of pixels each having color filters. Each of the plurality of pixels comprises a first sub-pixel, a second sub-pixel, a third sub-pixel, and a fourth sub-pixel. The first sub-pixel, the second sub-pixel, the third sub-pixel, and the fourth sub-pixel are arranged sequentially in a column direction. Each of the first sub-pixel, the second sub-pixel, the third sub-pixel and the fourth sub-pixel is extended in a row direction rather than in the column direction.

15 Claims, 5 Drawing Sheets

ORGANIC LIGHT-EMITTING DISPLAY DEVICE

CROSS-REFERENCE TO RELATED APPLICATIONS

This application claims the priority under 35 U.S.C. 119(a) of Republic of Korea Patent Application No. 10-2015-0177922 filed on Dec. 14, 2015, which is hereby incorporated by reference in its entirety.

BACKGROUND

Technical Field

The present disclosure relates to an organic light-emitting display device, and more specifically to an organic display device capable of reducing light leakage in a horizontal direction and improving color viewing angle characteristics in the horizontal direction.

Description of the Related Art

An organic light-emitting display device is a self-luminance display device and thus does not require an additional light source, such as a backlight for liquid crystal display (LCD) devices. Therefore, organic light-emitting display devices can be made lighter and thinner. Further, an organic light-emitting display device has advantages in that it is driven with low voltage to consume less power, and represents vivid colors, has a short response time, a wide viewing angle and a good contrast ratio (CR). For these reasons, an organic light-emitting display device is currently under development as the next generation display device.

An organic light-emitting display device displays images by using light emitted from an organic light-emitting element connected to a thin-film transistor (TFT) in each of the pixels or sub-pixels. The organic light-emitting element includes an emission layer made of an organic material formed between an anode and a cathode and emits light by applying an electric field across them, such that it can be driven with low voltage to consume less power, is light, and is applicable to a flexible upper substrate.

Organic light-emitting display devices may be divided into a top-emission organic light-emitting display device and a bottom-emission organic light-emitting display device, depending on a direction in which light exits. A bottom-emission organic light-emitting display device has high stability and high processing freedom degree, but has a limited aperture ratio and thus is difficult to be applied to high resolution products. For these reasons, a top-emission organic light-emitting display device is being recently studied.

For organic light-emitting display devices, a light source for three colors including red (R), green (G) and blue (B) is used to represent the full white color scheme.

Among methods for implementing a light source for three colors, there is a method in which red, green and blue organic light-emitting layers are formed in sub-pixels, respectively, such that each of the sub-pixels emits light independently. There is another method in which a plurality of emission layers are stacked one on another to form white organic light-emitting elements in a multi-stack configuration, and red, green or blue color filters are disposed thereon to emit light of a color via the color filter.

Such an existing organic light-emitting display device using white organic light-emitting elements in multi-stack and color filters may include a first substrate on which thin-film transistors and organic light-emitting elements are formed, and an opposing second substrate on which color filters are formed.

FIG. 1 is a plan view of an existing organic light-emitting display device having pixels arranged in vertical stripes.

Referring to FIG. 1, an existing organic light-emitting display device 10 having color filters may include a plurality of pixels 13 disposed on a substrate, each of the plurality of pixels 13 including a first sub-pixel 14, a second sub-pixel 15, a third sub-pixel 16 and a fourth sub-pixel 17.

In addition, referring to FIG. 1, the color filters disposed on a second substrate of the organic light-emitting display device 10 may include a red color filter R-CF, a green color filter G-CF, a blue color filter B-CF and a white color filter W-CF, which correspond to the first sub-pixel 14, the second sub-pixel 15, the third sub-pixel 16 and the fourth sub-pixel, respectively.

A black matrix (BM) 19 is formed between every two of the red color filter R-CF, the green color filter G-CF, the blue color filter B-CF and the white color filter W-CF on the second substrate of the organic light-emitting display device 10, so as to block light passing through one of the color filters from propagating to an adjacent color filter such that colors are not mixed in the adjacent pixel.

Typically, as can be seen from FIG. 1, in the existing organic light-emitting display device 10 including white organic light-emitting elements in multi-stack, color filters, and thin-film transistors, the organic light-emitting elements and corresponding color filters are arranged in vertical stripes.

Specifically, each of the first sub-pixel 14, the second sub-pixel 15, the third sub-pixel 16 and the fourth sub-pixel 17 in the pixel 13 are extended in a second direction Y that is a column direction of the organic light-emitting display device 10, rather than in a first direction X that is a row direction of the organic light-emitting display device 10. In addition, the first sub-pixel 14, the second sub-pixel 15, the third sub-pixel 16 and the fourth sub-pixel 17 are arranged sequentially such that they are adjacent to one another in the first direction X of the organic light-emitting display device 10.

FIG. 2 is a cross-sectional view taken along line II-II', which shows an example of light leakage in a horizontal direction occurring in an existing organic light-emitting display device 10 having pixels arranged in vertical stripes.

That is, FIG. 2 is a cross-sectional view taken along line II-II' illustrating light leakage in the horizontal direction occurring in an existing organic light-emitting display device 10 having pixels arranged in vertical stripes.

Referring to FIG. 2, a first substrate 11 may include a thin-film transistor 112 disposed on the first substrate 11, a first electrode 14a disposed on the thin-film transistor 112 in a first sub-pixel 14, a first electrode 15b formed in a second pixel 15, and a bank 18 disposed on the first electrodes 14a and 15b and between the first sub-pixel 14 and the second sub-pixel 15 to define the emission area of each of the sub-pixels. An emission layer formed by stacking a plurality of organic layers may be disposed on the first electrodes 14a and 15b and the bank 18.

In addition, referring to FIG. 2, a second substrate 12 facing the first substrate 11 may include a red color filter R-CF disposed in the first sub-pixel 14, a green color filter G-CF disposed in the second sub-pixel 15, and a black matrix (BM) 19 disposed between the red color filter R-CF and the green color filter G-CF.

The existing organic light-emitting display device 10 shown in FIG. 2 is fabricated by attaching the first substrate 11 including the first electrodes 14a and 15b and the emission layer to the second substrate 12 including the red color filter (R-CF) and the green color filter (G-CF). In doing so, the first substrate 11 or the second substrate 12 may deviate from a designed location, such that a misalignment 'A' may occur between the bank 18 disposed on the first substrate 11 and the black matrix 19 disposed on the second substrate 12.

If the misalignment 'A' occurs as shown in FIG. 2, light exiting through the first electrode 14a of the first sub-pixel 14 is not blocked by the black matrix 19. The light may exit through the green color filter G-CF formed in the second sub-pixel 15 adjacent to the first sub-pixel 14, as well as the red color filter R-CF, resulting in light leakage in the horizontal direction of the organic light-emitting device 10. As such, a color of a pixel may be represented in another pixel adjacent to the pixel, which is undesirable. As a result, color viewing angle characteristics of the organic light-emitting display device 10 may be deteriorated.

In addition, light leakage in the horizontal direction due to the misalignment 'A' in the organic light-emitting display device 10 may be affected also by a variation in a cell gap (i.e., the distance between the first and second substrates 11 and 12). This is also a problem to be improved.

SUMMARY

In view of the above problems recognized by the present inventors, an object of the present disclosure is to provide an organic light-emitting display device capable of reducing light leakage in a horizontal direction and improving color viewing angle characteristics in the horizontal direction.

It should be noted that objects of the present disclosure are not limited to the above-described objects, and other objects of the present disclosure will be apparent to those skilled in the art from the following descriptions.

According to an aspect of the present disclosure, there is provided an organic light-emitting display device capable of reducing light leakage in a horizontal direction and improving color viewing angle characteristics in the horizontal direction.

A top-emission organic light-emitting display device includes a plurality of pixels each having color filters. Each of the plurality of pixels comprises a first sub-pixel, a second sub-pixel, a third sub-pixel and a fourth sub-pixel. The first sub-pixel, the second sub-pixel, the third sub-pixel and the fourth sub-pixel are arranged sequentially in a column direction. Each of the first sub-pixel, the second sub-pixel, the third sub-pixel and the fourth sub-pixel is extended in a row direction rather than in the column direction.

According to an aspect of the present disclosure, there is provided a top-emission organic light-emitting display device comprising a plurality of pixels each having color filters, wherein a first sub-pixel, a second sub-pixel, a third sub-pixel and a fourth sub-pixel of each of the plurality of pixels are arranged in horizontal stripes and are extended in a row direction rather than in a column direction, thereby reducing light leakage in a horizontal direction, compared with pixels arranged in vertical stripes.

In a top-emission organic light-emitting display device comprising a plurality of pixels each having color filters, each of a first sub-pixel, a second sub-pixel, a third sub-pixel and a fourth sub-pixel of each of the plurality of pixels is extended in a row direction rather than in a column direction, and the first sub-pixel, the second sub-pixel, the third sub-pixel and the fourth sub-pixel are sequentially arranged in horizontal stripes, such that light leakage in a horizontal direction can be reduced compared with pixels arranged in vertical stripes in existing organic light-emitting display device, and color viewing angle characteristics in the horizontal direction can be improved.

It should be noted that effects of the present disclosure are not limited to those described above and other effects of the present disclosure will be apparent to those skilled in the art from the following descriptions.

The Summary is not to specify essential features of the appended claims, and thus the scope of the claims is not limited thereby.

BRIEF DESCRIPTION OF THE DRAWINGS

The above and other aspects, features and other advantages of the present disclosure will be more clearly understood from the following detailed description taken in conjunction with the accompanying drawings.

Figure (FIG. 1 is a plan view of an existing organic light-emitting display device having pixels arranged in vertical stripes, according to one embodiment.

DETAILED DESCRIPTION OF THE EMBODIMENTS

Figure 1:
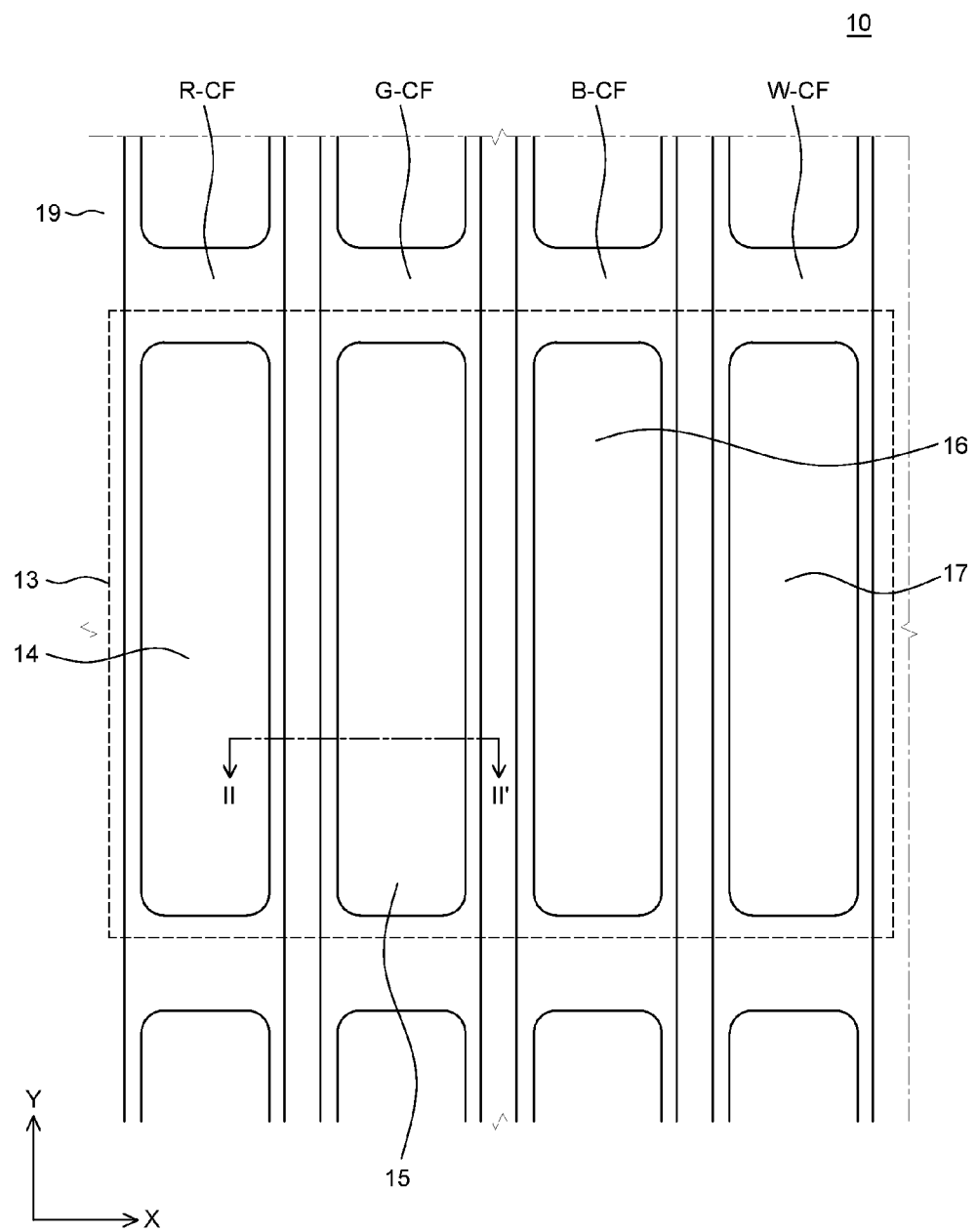
Figure 2:
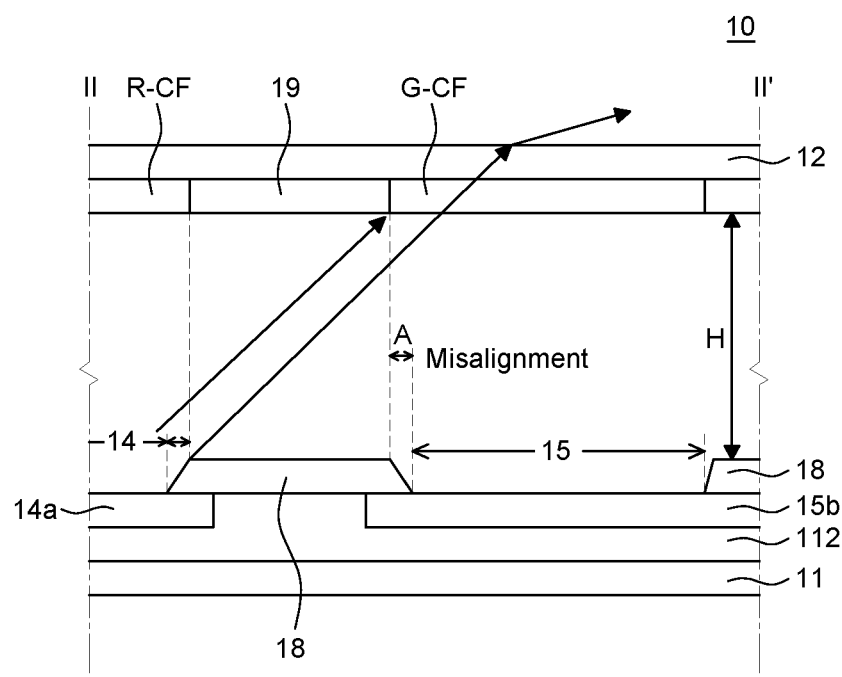
FIG. 2 is a cross-sectional view taken along line II-II', which shows an example of light leakage in a horizontal direction occurring in an existing organic light-emitting display device having pixels arranged in vertical stripes, according to one embodiment.

Advantages and features of the present disclosure and methods to achieve them will become apparent from the descriptions of embodiments hereinbelow with reference to the accompanying drawings. However, the present disclosure is not limited to embodiments disclosed herein but may be implemented in various different ways. The embodiments are provided for making the disclosure thorough and for fully conveying the scope to those skilled in the art. It is to be noted that the scope is defined only by the claims.

The figures, dimensions, ratios, angles, the numbers of elements given in the drawings are merely illustrative and are not limiting. Like reference numerals denote like elements throughout the descriptions. Further, in describing the present disclosure, descriptions on well-known technologies may be omitted in order not to unnecessarily obscure the gist of the present disclosure. It is to be noticed that the terms "comprising," "having," "including" and so on, used in the description and claims, should not be interpreted as being restricted to the means listed thereafter unless specifically stated otherwise. Where an indefinite or definite article is used when referring to a singular noun (e.g. "a," "an," "the,"), this includes a plural of that noun unless specifically stated otherwise.

The elements described herein are interpreted as including error margins even without explicit statements. In describing positional relationship, such as "an element A on an element B," "an element A above an element B," "an element A below an element B" and "an element A next to an element B," another element C may be disposed between the elements A and B unless the term "directly" or "immediately" is explicitly used.

As used herein, the terms first, second, etc., are used for distinguishing between similar elements and not necessarily for describing a sequential or chronological order. Theses terms are used to merely distinguish one element from another. Accordingly, as used herein, a first element may be a second element within the technical scope of the present disclosure.

Features of various embodiments of the present disclosure may be combined partially or totally. As will be clearly appreciated by those skilled in the art, various interactions and operations are possible. Various embodiments can be practiced individually or in combination.

Hereinafter, an organic light-emitting display device according to an embodiment of the present disclosure will be described in detail with reference to the accompanying drawings.

Figure 3:
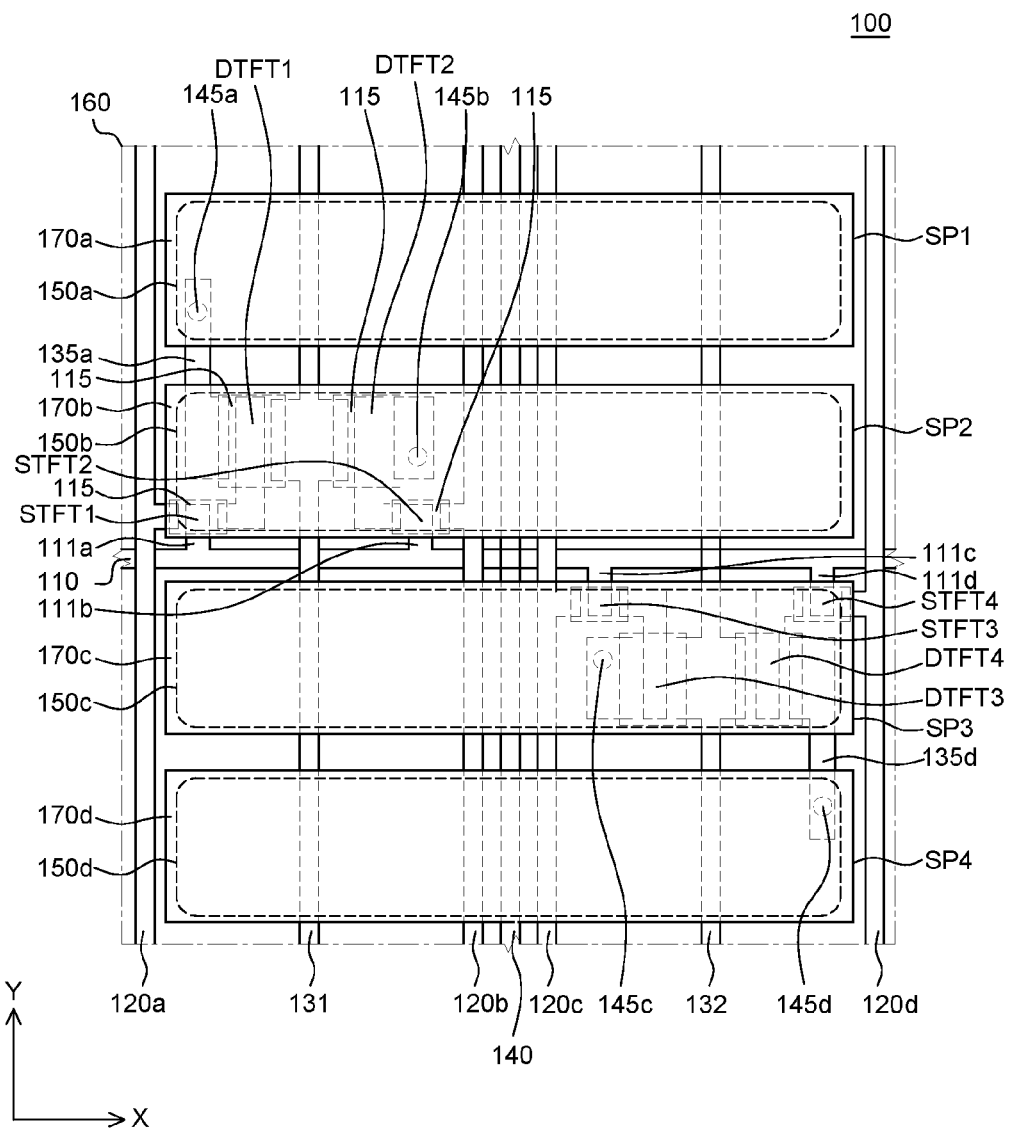
FIG. 3 is a plan view showing a structure of a pixel of an organic light-emitting display device having pixels arranged in horizontal stripes, according to an embodiment of the present disclosure.

FIG. 3 is a plan view showing a structure of a pixel of an organic light-emitting display device having pixels arranged in horizontal stripes, according to an embodiment of the present disclosure.

Figure 4:
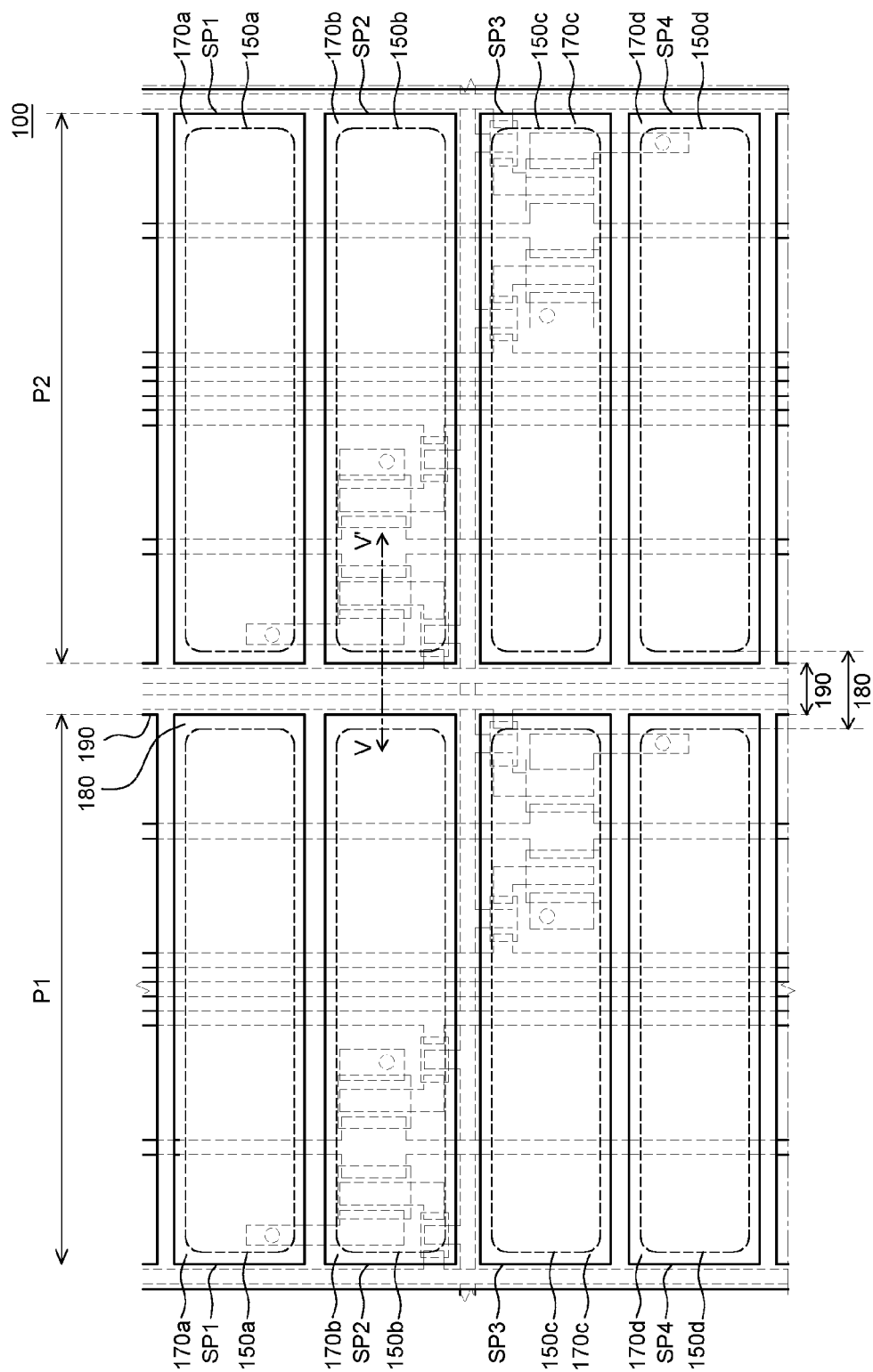
FIG. 4 is a plan view showing a structure of a pixel of an organic light-emitting display device having pixels arranged in horizontal stripes, according to one embodiment.

FIG. 4 is a plan view showing a layout of two pixels adjacent to each other in a horizontal direction of an organic light-emitting display device, according to an embodiment of the present disclosure.

Figure 5:
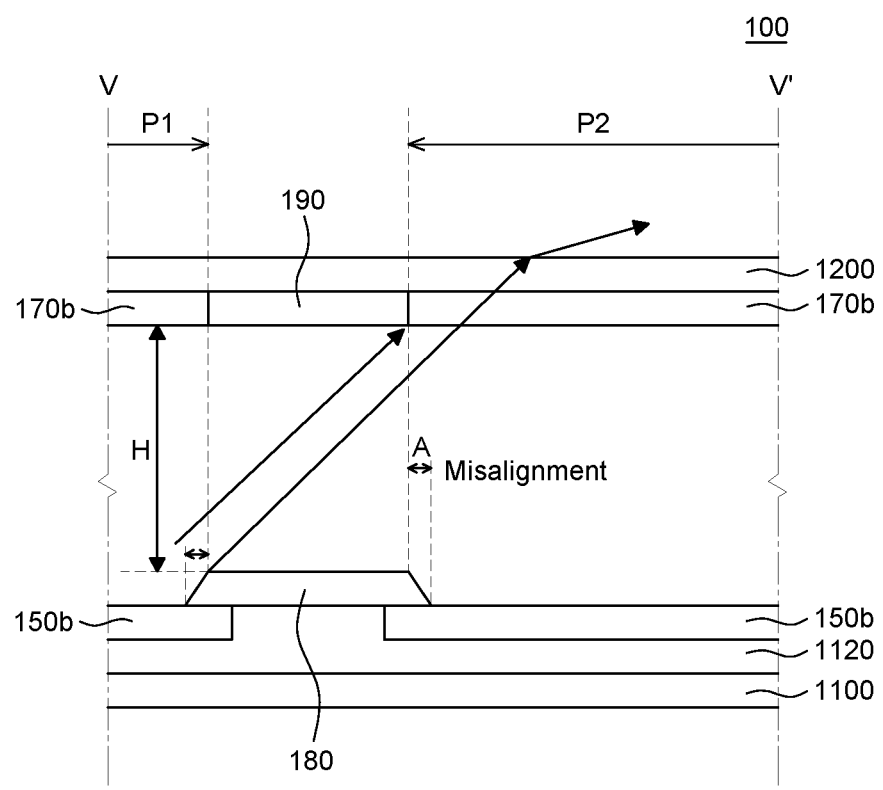
FIG. 5 is a plan view showing a structure of a pixel of an organic light-emitting display device having pixels arranged in horizontal stripes, according to one embodiment.

FIG. 5 is a cross-sectional view showing a structure of a pixel of an organic light-emitting display device, according to an embodiment of the present disclosure.

Referring to FIGS. 3 to 5, an organic light-emitting display device 100 includes: a first substrate 1100, a thin-film transistor 1120 disposed on the first substrate 1100, an organic light-emitting element disposed on the thin-film transistor 1120, a passivation layer, an encapsulation layer disposed on the organic light-emitting element, and a second substrate 1200 facing the first substrate 1100 and including color filters.

That is, the organic light-emitting display device 100 is a top-emission organic light-emitting display device using white organic light-emitting elements in multi-stack structure and color filters.

On the first substrate 1100 of the organic light-emitting display device 100, a thin-film transistor; an organic light-emitting element including a first electrode (anode), a second electrode (cathode), an emission layer (EML) disposed between the first electrode (anode) and the second electrode (cathode); and a passivation layer disposed on the organic light-emitting element.

In the organic light-emitting display device 100, the first substrate 1100 may be either a glass substrate or a plastic substrate made of polyethylene terephthalate (PET), polyethylene naphthalate (PEN), polyimide, or the like.

A buffer layer may be disposed on the first substrate 1100 to block permeation of atoms of impurities. The buffer layer may be made up of a single layer or multiple layers of silicon nitride ($SiN_x$) or silicon oxide ($SiO_x$), for example.

In addition, in the organic light-emitting display device 100, a thin-film transistor 1120 formed on the first substrate 1100 may include a gate electrode, a gate insulation layer, a semiconductor layer, a source electrode and a drain electrode. In addition, a passivation layer and a planarization layer may be further disposed on the thin-film transistor 1120.

More specifically, the gate electrode of the thin-film transistor 1120 delivers a gate signal to a thin-film transistor array, and may be made up of a single layer or a plurality of layers of at least one metal of Al, Pt, Pd, Ag, Mg, Au, Ni, Nd, Ir, Cr, Li, Ca, Mo, Ti, W and Cu or an alloy thereof. The gate insulation layer may be made of an inorganic insulative material such as $SiO_x$, $SiN_x$ or the like.

The semiconductor layer may be made of, but is not limited to, a metal oxide such as indium gallium zinc oxide (IGZO), zinc tin oxide (ZTO) and zinc indium oxide (ZIO), or may be made of amorphous silicon or poly silicon.

In addition, the source electrode and the drain electrode electrically connected to the semiconductor layer may be made of a refractory metal such as chromium (Cr), tantalum (Ta) or the like.

The passivation layer and the planarization layer may be formed as an organic film or an inorganic film having hydrophobic properties, such as polystyrene, a siloxane series resin, and an acrylic resin, SiON, $SiN_x$, $SiO_x$, $AlO_x$.

In the organic light-emitting display device 100, the organic light-emitting element may be formed on and connected to the thin-film transistor 1120, and may be made up of multiple organic layers including a first electrode (anode) 150b, a second electrode (cathode), an emission layer EML disposed between the first electrode (anode) 150b and the second electrode (cathode).

The organic light-emitting element is disposed between the first electrode 150b and the second electrode (cathode). The emission layer EML emits light as holes supplied from the first electrode 150b combine with electrons supplied from the second electrode (cathode).

More specifically, the organic light-emitting element may include the first electrode 150b, a bank 180 whose end portion overlaps the first electrode 150b to expose a part of the first electrode 150b, multiple organic layers and the emission layer (EML) disposed on the exposed part of the first electrode 150b, and the second electrode (cathode) covering the multiple organic layers, the emission layer EML and the bank 180.

More specifically, the first electrode 150b disposed on the passivation layer or the planarization layer of the thin-film transistor 1120 may be made of a transparent, conductive material having a high work function value to work as an anode (a positive electrode), such as a metal oxide such as indium tin oxide (ITO) or indium zinc oxide (IZO), a mixture of a metal and oxide such as ZnO:Al or SnO2:Sb, carbon nanotube, graphene and nano silver wire.

In the case where the organic light-emitting display device 100 is of a top-emission organic light-emitting display device, a reflective electrode made of a metal material having high reflectivity (e.g., aluminum (Al) or silver (Ag)) may be disposed on or under the first electrode 150b as an auxiliary electrode, in order to increase reflection efficiency.

As used herein, top-emission type refers to a display device in which light emitted from an emission layer exits through the second substrate 1200, whereas bottom-emission type refers to a display device in which light emitted from an emission layer exits through the first substrate 1100.

The bank 180 is formed on the first electrode 150b and has an opening via which a part of the first electrode 150b is exposed. The bank 180 defines an emission area of the organic light-emitting display device 100 and blocks light leakage from a non-emission area.

That is, the bank 180 defines the emission area of the organic light-emitting display device 100 and may be made of an organic material having hydrophobic properties such as polystyrene, poly(methyl methacrylate) (PMMA), a benzocyclobutene series resin, a siloxane series resin, a silane resin, an acrylic resin, and the like.

The multiple layers including the emission layer EML may include a hole injection layer (HIL), a hole transporting layer (HTL), the emission layer (EML), an electron transporting layer (ETL) and an electron injection layer (EIL). These layers may be independent or some functionalities can be implemented into other layers such that two or more layers are combined or integrated together.

The hole injection layer HIL is disposed on the first electrode 150b. The hole injection layer HIL may serve to facilitate hole injection and may be made of, but is not limited to, at least one selected from the group consisting of HATCN, CuPc (cupper phthalocyanine), PEDOT (poly(3, 4)-ethylenedioxythiophene), PANI (polyaniline) and NPD (N,N-dinaphthyl-N,N'-diphenylbenzidine).

The hole transporting layer HTL is disposed on the hole injection layer HIL. The hole transporting layer HTL may serve to facilitate hole transportation and may be made of, but is not limited to, at least one selected from the group consisting of NPD (N,N-dinaphthyl-N,N'-diphenylbenzidine), TPD (N,N'-bis-(3-methylphenyl)-N, N'-bis-(phenyl)-benzidine), s-TAD and, MTDATA (4,4',4"-Tris(N-3-methylphenyl-N-phenyl-amino)-triphenylamine).

The emission layer EML is disposed on the hole transporting layer HTL. The emission layer EML is formed between the hole transporting layer HTL and the electron transporting layer ETL and emits white light as holes supplied from the first electrode 150b combine with electrons supplied from the second electrode 170.

The electron transporting layer ETL is disposed on the emissive layer EML. The thickness of the electron transporting layer ETL may be adjusted depending on the electron transportation characteristics. The electron transporting layer ETL may perform electron transportation and injection. The electron injection layer EIL may be additionally formed on the electron transporting layer ETL.

The electron transporting layer ETL may serve to facilitate hole transportation and may be made of, but is not limited to, at least one selected from the group consisting of Alq3 (tris(8-hydroxyquinolino) aluminum), PBD, TAZ, Spiro-PBD, BAlq, Liquid (lithium quinolate), BMB-3T, PF-6P, TPBI, COT and SAlq.

The electron injection layer EIL may be, but is not limited to, Alq3 (tris(8-hydroxyquinolino)aluminum), PBD, TAZ, spiro-PBD, BAlq or SAlq.

It is to be understood that the structure of the organic light-emitting display device 100 is not limited to that of the embodiment of the present disclosure. At least one of the hole injection layer HIL, the hole transporting layer HTL, the electron transporting layer ETL and the electron injection layer EIL may be eliminated.

In addition, the hole injection layer HIL, the hole transporting layer HTL, the electron transporting layer ETL and the electron injection layer EIL may be made up of two or more layers.

The second electrode may be a cathode (a negative electrode) and may be made of a material having a relatively low work function. For example, in the case where the organic light-emitting display device is of a bottom-emission organic light-emitting display device, the second electrode may be made up of a single layer or multiple layers of an alloy of a first metal having high reflectivity (e.g., Ag and a second metal or Mg at a predetermined ratio). In addition, a capping layer for improving luminous efficiency may be further disposed on the second electrode.

In addition, a passivation layer may be formed on the second electrode (cathode) of the organic light-emitting element. The passivation layer may cover the organic light-emitting element completely so as to protect the emission layer as well as the organic layers and internal components from moisture or oxygen permeating from the outside.

The passivation layer may be formed by a physical vapor deposition such as sputtering or thermal deposition or by a chemical vapor deposition.

Further, the organic light-emitting display device 100 may include the second substrate 1200 that faces the first substrate 1100 and has color filters.

The second substrate 1200 may be attached to the first substrate 1100 by a dam and a fill disposed between the first and second substrates 1100 and 1200 on the inner side of the dam.

The second substrate 1200 of the organic light-emitting display device 100 may include a first sub-pixel, a second sub-pixel, a third sub-pixel and a fourth sub-pixel which represent red (R), green (G), blue (B) and white (W), respectively, defined by a black matrix 190. The first sub-pixel representing red may include a red color filter 170a, the second sub-pixel representing green may include a green color filter 170b, the third sub-pixel representing blue may include a blue color filter 170c, and the fourth sub-pixel representing white may include no color filter.

More specifically, referring to FIG. 3, in the top-emission organic light-emitting display device 100 including a plurality of pixels having color filters arranged in horizontal stripes, a pixel 160 may include a first sub-pixel SP1, a second sub-pixel SP2, a third sub-pixel SP3, and a fourth sub-pixel SP4.

Each of the plurality of pixels may include one gate line 110 extended in a first direction (X) of the organic light-emitting display device 100, and four data lines 120a, 120b, 120c, and 120d extended in a second direction (Y) of the organic light-emitting display device 100.

Unlike in some existing organic light-emitting display devices having pixels arranged in vertical stripes, the first sub-pixel SP1, the second sub-pixel SP2, the third sub-pixel SP3, and the fourth sub-pixel SP4 of the top-emission organic light-emitting display device 100 including a plurality of pixels having color filters arranged in horizontal stripes are arranged in the second direction Y that is the column direction of the organic light-emitting display device 100.

In addition, the first sub-pixel SP1, the second sub-pixel SP2, the third sub-pixel SP3, and the fourth sub-pixel SP4 are extended in the first direction X that is the row direction of the organic light-emitting display device 100, rather than in the second direction Y that is the column direction. For example, referring to FIG. 3, each of the first sub-pixel SP1, the second sub-pixel SP2, the third sub-pixel SP3, and the fourth sub-pixel SP4 may have a rectangular shape with horizontal sides longer than vertical sides.

In addition, the first sub-pixel SP1, the second sub-pixel SP2, the third sub-pixel SP3, and the fourth sub-pixel SP4 may include first electrodes 150a, 150b, 150c and 150d, respectively, that are extended in the first direction X rather than in the second direction Y. The first sub-pixel SP1, the second sub-pixel SP2 and the third sub-pixel SP3 may be associated with a red color filter 170a, a green color filter 170b and a blue color filter 170c, respectively. The fourth sub-pixel SP4 may be associated with a white color filter 170d representing white and may not include any color filter.

In the top-emission organic light-emitting display device 100 including a plurality of pixels having color filters arranged in horizontal stripes, a single pixel 160 may have a 2T1C structure that includes a switching TFT (STFT), a driving TFT (DTFT), a storage capacitor and an organic light-emitting element. It is to be noted that the structure of the pixel is not limited to the 2T1C. The pixel may have more than two thin-film transistors and more than one capacitor.

Referring to FIG. 3, a pixel 160 of the organic light-emitting display device 100 includes the gate line 110 extended in the first direction X. The gate line 110 may be disposed between the second sub-pixel SP2 and the third sub-pixel SP3.

In addition, referring to FIG. 3, the first sub-pixel SP1 and the second pixel SP2 of the organic light-emitting display device 100 may be switched via a first gate electrode 111a and a second gate electrode 111b, respectively, that are extended from the gate line 110 toward the first sub-pixel SP1.

More specifically, referring to FIG. 3, a first switching transistor STFT1 for switching the first sub-pixel SP1 and a second switching transistor STFT2 for switching the second sub-pixel SP2 may be disposed in a location corresponding to the second sub-pixel SP2. Each of the first switching transistor STFT1 and the second switching transistor STFT2 may include a semiconductor layer 115.

In addition, referring to FIG. 3, a first driving transistor DTFT1 for driving the first sub-pixel SP1 and a second driving transistor DTFT2 for driving the second pixel SP2 may be disposed in a location corresponding to the second sub-pixel SP2. Further, each of the first driving transistor DTFT1 and the second driving transistor DTFT2 may include a semiconductor layer 115.

In addition, referring to FIG. 3, a first power supply line (VDD line) 131 that supplies driving signals to the first driving transistor DTFT1 and the second driving transistor DTFT2 may be a line extended in the second direction Y, and may be disposed between the first driving transistor DTFT1 and the second driving transistor DTFT2 so as to be connected thereto.

The first electrode 150a of the first sub-pixel SP1 may be electrically connected to the first driving transistor DTFT1 disposed in the second sub-pixel SP2 via a first connection electrode 135a.

In addition, referring to FIG. 3, the third sub-pixel SP3 and the fourth pixel SP4 of the organic light-emitting display device 100 may be switched via a third gate electrode 111c and a fourth gate electrode 111d, respectively, that are extended from the gate line 110 toward the fourth sub-pixel SP4.

More specifically, referring to FIG. 3, a third switching transistor STFT3 for switching the third sub-pixel SP3 and a fourth switching transistor STFT4 for switching the fourth sub-pixel SP4 may be disposed in a location corresponding to the third sub-pixel SP3.

In addition, referring to FIG. 3, a third driving transistor DTFT3 for driving the third sub-pixel SP3 and a fourth driving transistor DTFT4 for driving the fourth pixel SP4 may be disposed in a location corresponding to the third sub-pixel SP3.

In addition, referring to FIG. 3, a second power supply line (VDD line) 132 that supplies driving signals to the third driving transistor DTFT3 and the fourth driving transistor DTFT4 may be a line extended in the second direction Y, and may be disposed between the third driving transistor DTFT3 and the fourth driving transistor DTFT4 so as to be connected thereto.

The third driving transistor DTFT3 for driving the third sub-pixel SP3 and the fourth driving transistor DTFT4 for driving the fourth sub-pixel SP4 may be disposed in the third sub-pixel SP3. The second voltage line 132 may be disposed in the second direction Y to supply driving signals to the third driving transistor DTFT3 and the fourth driving transistor DTFT4.

The first electrode 150d of the fourth sub-pixel SP4 may be electrically connected to the fourth driving transistor DTFT4 disposed in the third sub-pixel SP3 via a second connection electrode 135d.

Further, referring to FIG. 3, the organic light-emitting display device 100 may include the first data line 120a supplying a signal to the first sub-pixel SP1, the second data line 120b supplying a signal to the second sub-pixel SP2, the third data line 120c supplying a signal to the third sub-pixel SP3, and the fourth data line 120d supplying a signal to the fourth sub-pixel SP4, which are lines extended in the second direction Y.

In addition, referring to FIG. 3, the organic light-emitting display device 100 may further include a third power supply line (VSS line) 140 disposed between the second data line 120b and the third data line 120c.

In addition, referring to FIG. 3, in the organic light-emitting display device 100, the first electrode 150a of the first sub-pixel SP1, the first electrode 150b of the second sub-pixel SP2, the first electrode 150c of the third sub-pixel SP3, and the first electrode 150d of the fourth sub-pixel SP4 are connected to the first driving transistor DTFT1, the second driving transistor DTFT2, the third driving transistor DTFT3, and the fourth driving transistor DTFT4 via contact holes 145a, 145b, 145c and 145d, respectively. The contact holes 145a, 145b, 145c and 145d may be disposed different rows when viewed from the top.

That is, the organic light-emitting display device 100 may include the contact holes 145a, 145b, 145c and 145d arranged in the second direction Y sequentially in different rows, such that they are associated with the first sub-pixel SP1, the second sub-pixel SP2, the third sub-pixel SP3, and the fourth sub-pixel SP4 arranged sequentially in the second direction Y, respectively.

Referring to FIGS. 4 and 5, the organic light-emitting display device 100 may include a first pixel P1 and a second pixel P2 that is disposed adjacent to the first pixel P1 in the horizontal direction (i.e., the first direction X).

More specifically, as shown in FIG. 4, a first electrode 150a of a first sub-pixel SP1 included in the first pixel P1 is adjacent to a first electrode 150a of a first sub-pixel SP1 included in the second pixel P2 with a bank 180 therebetween. A first electrode 150b of a second sub-pixel SP2 included in the first pixel P1 is adjacent to a first electrode 150b of a second sub-pixel SP2 included in the second pixel P2 with the bank 180 therebetween. A first electrode 150c of a third sub-pixel SP3 included in the first pixel P1 is adjacent to a first electrode 150c of a third sub-pixel SP3 included in the second pixel P2 with the bank 180 therebetween. A first electrode 150d of a fourth sub-pixel SP4 included in the first pixel P1 is adjacent to a first electrode 150d of a fourth sub-pixel SP4 included in the second pixel P2 with the bank 180 therebetween. Each pair of the sub-pixels adjacent to each other may represent light of the same color.

That is, a red color filter 170a of the first sub-pixel SP1 included in the first pixel P1 is adjacent to a red color filter 170a of the first sub-pixel SP1 included in the second pixel P2 with the black matrix 190 therebetween. A green color filter 170b of the second sub-pixel SP2 included in the first pixel P1 is adjacent to a green color filter 170b of the second sub-pixel SP2 included in the second pixel P2 with the black matrix 190 therebetween. A blue color filter 170c of the third sub-pixel SP3 included in the first pixel P1 is adjacent to a blue color filter 170c of the third sub-pixel SP3 included in the second pixel P2 with the black matrix 190 therebetween. A white color filter 170d of the fourth sub-pixel SP4 included in the first pixel P1 is adjacent to a white color filter 170d of the fourth sub-pixel SP4 included in the second pixel P2 with the black matrix 190 therebetween. Each pair of the sub-pixels adjacent to each other may represent light of the same color.

FIG. 5 shows an example where a misalignment 'A' takes place between the bank 180 and the black matrix 190 in the organic light-emitting display device 100 during the process of attaching the first substrate 1100 and the second substrate 1200 together, as the first substrate 1100 or the second substrate 1200 deviates from a designed location. When this happens, light exiting through the first electrode 150b formed in the first pixel P1 is not covered by the black matrix 190 and propagates through the green color filter 170b of the second pixel P2 adjacent to the first pixel P1 in the first direction X. Nevertheless, light leakage does not occur because both of the first pixel P1 and the second pixel P2 represent the same color, in this example green.

That is, in the organic light-emitting display device 100, pixels representing the same color are arranged in the first direction X, such that it is possible to suppress light leakage causing an undesirable color to be displayed, which occurs between sub-pixels adjacent to each other in the horizontal direction in existing organic light-emitting display devices. As a result, color viewing angle characteristics of organic light-emitting display devices can be improved.

In summary, in a top-emission organic light-emitting display device comprising a plurality of pixels each having color filters, each of a first sub-pixel, a second sub-pixel, a third sub-pixel, and a fourth sub-pixel of each of the plurality of pixels is extended in a first direction that is the row direction rather than in a second direction that is the column direction, and the first sub-pixel, the second sub-pixel, the third sub-pixel, and the fourth sub-pixel are sequentially arranged in the second direction in horizontal stripes, such that light leakage in the horizontal direction can be reduced compared with pixels arranged in vertical stripes in existing organic light-emitting display device, and color viewing angle characteristics in the horizontal direction can be improved.

The embodiments of the present disclosure can also be described as follows:

According to an aspect of the present disclosure, a top-emission organic light-emitting display device includes a plurality of pixels each having color filters. Each of the plurality of pixels comprises a first sub-pixel, a second sub-pixel, a third sub-pixel, and a fourth sub-pixel. The first sub-pixel, the second sub-pixel, the third sub-pixel, and the fourth sub-pixel are arranged sequentially in a column direction. Each of the first sub-pixel, the second sub-pixel, the third sub-pixel, and the fourth sub-pixel is extended in a row direction rather than in the column direction.

Each of the first sub-pixel, the second sub-pixel, the third sub-pixel and the fourth sub-pixel may include a first electrode extended in the row direction rather than in the column direction.

The device may further include: a gate line extended in the row direction, and the gate line may be between the second sub-pixel and the third sub-pixel.

The first sub-pixel and the second sub-pixel may be switched via respective gate electrodes extended from the gate line toward the first sub-pixel.

A first driving transistor for driving the first sub-pixel and a second driving transistor for driving the second sub-pixel may be disposed in the second sub-pixel. A first power supply line may be extended in the column direction to supply driving signals to the first driving transistor and the second driving transistor.

The first electrode of the first sub-pixel may be electrically connected to the first driving transistor disposed in the second sub-pixel.

The third sub-pixel and the fourth sub-pixel may be switched via respective gate electrodes extended from the gate line toward the fourth sub-pixel.

A third driving transistor for driving the third sub-pixel and a fourth driving transistor for driving the fourth sub-pixel may be disposed in the third sub-pixel. A second power supply line may be disposed in the column direction to supply driving signals to the third driving transistor and the fourth driving transistor.

The first electrode of the fourth sub-pixel may be electrically connected to the fourth driving transistor disposed in the third sub-pixel.

The device may further include: first to fourth data lines extended in the column direction. The first data line may supply a signal to the first sub-pixel, the second data line may supply a signal to the second sub-pixel, the third data line may supply a signal to the third sub-pixel, and the fourth data line may supply a signal to the fourth sub-pixel.

The device may further include: a third power supply line disposed between the second data line and the third data line.

The first electrodes of the first sub-pixel, the second sub-pixel, the third sub-pixel and the fourth sub-pixel may be connected to the respective driving transistors via contact holes, and the contact holes may be disposed in different rows.

The first sub-pixel, the second sub-pixel, the third sub-pixel, and the fourth sub-pixel may be associated with the color filters so that they represent any color of red, green, blue and white, respectively.

According to an another aspect of the present disclosure, a top-emission organic light-emitting display device includes a plurality of pixels each having color filters. A first sub-pixel, a second sub-pixel, a third sub-pixel, and a fourth sub-pixel of each of the plurality of pixels are arranged in horizontal stripes and are extended in a row direction rather than in a column direction, thereby reducing light leakage in a horizontal direction, compared with pixels arranged in vertical stripes.

The first sub-pixel, the second sub-pixel, the third sub-pixel, and the fourth sub-pixel may be arranged sequentially in the column direction of the organic light-emitting display device.

Each of the plurality of pixels may include one gate line extended in the row direction of the organic light-emitting display device and four data lines extended in the column direction of the organic light-emitting display device.

The organic light-emitting display device may further include: first to fourth switching transistors configured to switch the first sub-pixel, the second sub-pixel, the third sub-pixel and the fourth sub-pixel, respectively, wherein the first switching transistor and the second switching transistor correspond to the second sub-pixel, and the fourth switching transistor and the fourth switching transistor correspond to the third sub-pixel.

The organic light-emitting display device may further include: first to fourth driving transistors configured to drive the first sub-pixel, the second sub-pixel, the third sub-pixel and the fourth sub-pixel, respectively. The first switching transistor and the second switching transistor may be corresponding to the second sub-pixel, and the fourth switching transistor and the fourth switching transistor may be corresponding to the third sub-pixel.

Thus far, embodiments of the present disclosure have been described in detail with reference to the accompanying drawings. However, the present disclosure is not limited to the embodiments, and modifications and variations can be made thereto without departing from the technical idea of the present disclosure. Accordingly, the embodiments described herein are merely illustrative and are not intended to limit the scope of the present disclosure. The technical idea of the present disclosure is not limited by the embodiments. Therefore, it should be understood that the above-described embodiments are not limiting but illustrative in all aspects. The scope of protection sought by the present disclosure is defined by the appended claims and all equivalents thereof are construed to be within the true scope of the present disclosure.

What is claimed is:

1. A top-emission organic light-emitting display device comprising:
    a plurality of pixels each having color filters, wherein each of the plurality of pixels comprises a first sub-pixel, a second sub-pixel, a third sub-pixel, and a fourth sub-pixel;
    first to fourth switching transistors configured to switch the first sub-pixel, the second sub-pixel, the third sub-pixel and the fourth sub-pixel, respectively; and
    first to fourth driving transistors configured to drive the first sub-pixel, the second sub-pixel, the third sub-pixel and the fourth sub-pixel, respectively,
        wherein the first sub-pixel, the second sub-pixel, the third sub-pixel, and the fourth sub-pixel are arranged sequentially in a column direction,
        wherein each of the first sub-pixel, the second sub-pixel, the third sub-pixel, and the fourth sub-pixel extends in a row direction rather than in the column direction,
        wherein each of the first sub-pixel, the second sub-pixel, the third sub-pixel, and the fourth sub-pixel comprises a first electrode extended in the row direction rather than in the column direction and correspond to the first sub-pixel, the second sub-pixel, the third sub-pixel, and the fourth sub-pixel, respectively, and
        wherein the first switching transistor, the second switching transistor, the first driving transistor and the second driving transistor overlap the first electrode of the second sub-pixel, and the third switching transistor, the fourth switching transistor, the third driving transistor and the fourth driving transistor overlap the first electrode of the third sub-pixel.

2. The device of claim 1, further comprising:
    a gate line extended in the row direction,
    wherein the gate line is between the second sub-pixel and the third sub-pixel.

3. The device of claim 2, wherein the first sub-pixel and the second sub-pixel are switched via respective gate electrodes extended from the gate line toward the first sub-pixel.

4. The device of claim 3, further comprising:
    a first power supply extended in the column direction and configured to supply driving signals to the first driving transistor and the second driving transistor.

5. The device of claim 4, wherein the first electrode of the first sub-pixel is electrically connected to the first driving transistor in the second sub-pixel.

6. The device of claim 2, wherein the third sub-pixel and the fourth sub-pixel are switched via respective gate electrodes extended from the gate line toward the fourth sub-pixel.

7. The device of claim 6, further comprising:
    a second power supply line extended in the column direction and configured to supply driving signals to the third driving transistor and the fourth driving transistor.

8. The device of claim 7, wherein the first electrode of the fourth sub-pixel is electrically connected to the fourth driving transistor in the third sub-pixel.

9. The device of claim 2, further comprising:
    first to fourth data lines extended in the column direction,
    wherein the first data line supplies a signal to the first sub-pixel, the second data line supplies a signal to the second sub-pixel, the third data line supplies a signal to the third sub-pixel, and the fourth data line supplies a signal to the fourth sub-pixel.

10. The device of claim 9, further comprising:
    a third power supply line between the second data line and the third data line.

11. The device of claim 1, wherein the first electrodes of the first sub-pixel, the second sub-pixel, the third sub-pixel and the fourth sub-pixel are connected to the respective driving transistors via contact holes, and wherein the contact holes are disposed in different rows.

12. The device of claim 1, wherein each of the first sub-pixel, the second sub-pixel, the third sub-pixel and the fourth sub-pixel is associated with one of the color filters to represent red, green, blue or white.

13. A top-emission organic light-emitting display device comprising a plurality of pixels each having color filters,
    wherein each of the plurality of pixels includes one gate line extended in a row direction and four data lines extended in a column direction, and the plurality of pixels include a first pixel and a second pixel that is disposed adjacent to the first pixel in the row direction,
    wherein each of the first pixel and the second pixel comprises a first sub-pixel, a second sub-pixel, a third sub-pixel, and a fourth sub-pixel, each of the first sub-pixel, the second sub-pixel, the third sub-pixel, and the fourth sub-pixel of each of the plurality of pixels comprises a first electrode extended in the row direction and not in the column direction,
    wherein the first sub-pixel, the second sub-pixel, the third sub-pixel and the fourth sub-pixel of each of the plurality of pixels are arranged in horizontal stripes and are extended in a row direction rather than in a column direction, and each of the sub-pixels of the first pixel and the second pixel adjacent to each other in the row direction represents light of a same color, to reduce light leakage in a horizontal direction due to a misalignment between a bank and a black matrix compared with pixels arranged in vertical stripes,
    wherein each of the first pixel and the second pixel comprises first to fourth switching transistors configured to switch the first sub-pixel, the second sub-pixel, the third sub-pixel, and the fourth sub-pixel, respectively, and first to fourth driving transistors configured to drive the first sub-pixel, the second sub-pixel, the third sub-pixel, and the fourth sub-pixel, respectively, and
    wherein the first switching transistor, the second switching transistor, the first driving transistor, and the second driving transistor overlap the first electrode of the second sub-pixel, and the third switching transistor, the fourth switching transistor, the third driving transistor, and the fourth driving transistor overlap the first electrode of the third sub-pixel.

14. The device of claim 13,
wherein the first electrode of the first sub-pixel included in the first pixel is adjacent to the first electrode of the first sub-pixel included in the second pixel with the bank therebetween, the first electrode of the second sub-pixel included in the first pixel is adjacent to the first electrode of the second sub-pixel included in the second pixel with the bank therebetween, the first electrode of a the third sub-pixel included in the first pixel is adjacent to the first electrode of the third sub-pixel included in the second pixel with the bank therebetween, the first electrode of the fourth sub-pixel included in the first pixel is adjacent to the first electrode of the fourth sub-pixel included in the second pixel with the bank therebetween, and each pair of the sub-pixels adjacent to each other represents light of the same color.

15. The device of claim 14, wherein a red color filter of the first sub-pixel included in the first pixel is adjacent to a red color filter of the first sub-pixel included in the second pixel with the black matrix therebetween, a green color filter of the second sub-pixel included in the first pixel is adjacent to a green color filter of the second sub-pixel included in the second pixel with the black matrix therebetween, a blue color filter of the third sub-pixel included in the first pixel is adjacent to a blue color filter of the third sub-pixel included in the second pixel with the black matrix therebetween, and a white color filter of the fourth sub-pixel included in the first pixel is adjacent to a white color filter of the fourth sub-pixel included in the second pixel with the black matrix therebetween.

* * * * *